US006116766A

United States Patent [19]

Maseeh et al.

[11] Patent Number: 6,116,766

[45] Date of Patent: Sep. 12, 2000

[54] FABRICATION BASED COMPUTER AIDED DESIGN SYSTEM USING VIRTUAL FABRICATION TECHNIQUES

[76] Inventors: Fariborz Maseeh, 16 Upton Dr., Wilmington, Mass. 01887; Yie He, 16 Meridian Pkwy., Malden, Mass. 02148; Gennady Napadensky, 158 Harvard Ave., Apt. 1, Brookline, Mass. 02146

[21] Appl. No.: 08/843,330

[22] Filed: Apr. 15, 1997

[51] Int. Cl.[7] .................................................... G06F 19/00

[52] U.S. Cl. ............................... 364/468.03; 364/468.09; 364/578; 364/488; 395/500

[58] Field of Search ......................... 364/468.03, 468.04, 364/468.09, 468.28, 149–151, 488–491, 578, 468.15, 468.16; 395/500

[56] References Cited

U.S. PATENT DOCUMENTS

| | | | |
|---|---|---|---|
| 4,796,194 | 1/1989 | Atherton | 364/468.09 |
| 5,105,362 | 4/1992 | Kotani | 364/468.28 X |
| 5,495,417 | 2/1996 | Fukuda | 364/468.28 |
| 5,655,110 | 8/1997 | Krivokapic et al. | 364/468.01 X |
| 5,719,796 | 2/1998 | Chen | 364/468.15 X |
| 5,787,269 | 7/1998 | Hyodo | 364/468.09 X |

*Primary Examiner*—Paul P. Gordon
*Assistant Examiner*—Steven R. Garland

[57] ABSTRACT

A fabrication process based fabrication, modeling and analysis tool that allows the user to accurately design, visualize, simulate, and analyze the design of a micro-electro mechanical (MEMS) or other semiconductor device through a computer aided simulation of its actual fabrication process. The preferred embodiment creates a creates a model of both a device having the desired parameters and attributes and the necessary fabrication steps in the fabrication process to yield that device. The tool is suitable for implementation on existing general purpose computers. The tool involves a method comprising the general steps of, building a Process Table comprised of fabrication process steps, checking each step in the Process Table against a parameter set contained in a database of actual fabrication process steps, visualizing the geometry of a device yielded by performing the process steps in the Process Table, performing an analysis on the device yielded by performing the process steps in the Process Table by applying loads and boundary conditions to the device yielded by performing the process steps in the Process Table, discretizing the device structure, performing one or more methods of electrical, chemical, or mechanical analyses on the discretized structure; and visualizing the results of the analysis in graphical or tabular format. The analysis and discretization methods further employ a method of meshing the structure of the device comprising the steps of, generating a global three-dimensional volume mesh from the model; extracting a global surface mesh from the volume mesh, locating the exposed face surface mesh on the global surface mesh, refining the exposed face surface mesh by removing all non-exposed faces, performing an analysis over the refined exposed face surface mesh, relating the results of the analysis on the refined exposed face surface mesh to the global surface mesh and the global volume mesh.

15 Claims, 3 Drawing Sheets

BUILD PROCESS DESCRIPTION USING PROCESS TABLE
DESIGN DATABASE
BUILD PROCESS TABLE USING PROCESS TEMPLATE(S)
BUILD PROCESS TABLE USING INDIVIDUAL PROCESS STEPS
FABRICATION DATABASE
EXPERT PROCESS CHECK
VISUALIZE GEOMETRY/SOLID MODEL OF PROCESS STEPS
GENERATE MATERIAL PROPERTY INFORMATION
MATERIAL PROPERTY DATABASE
APPLY LOADS & BOUNDARY CONDITIONS
DISCRETIZE STRUCTURE
LOCAL REFINE/ GLOBAL REFINE
ANALYSIS OF STRUCTURE
1. ELECTROSTATIC
2. THERMOMECHANICAL
3. COUPLED
4. ELECTROMAGNETIC
5. FLUID DYNAMICS
6. ELECTRON FLOW
7. RADIATION
ALTER DEVICE DIMENSIONS AND/OR PROCESS CONDITIONS
VISUALIZE RESULTS FOR GIVEN DEVICE DIMENSIONS AND PROCESS CONTROLS
FURTHER REFINE STRUCTURE?
Y
N
PROCESS TABLE CONTAINING PROCESS DESCRIPTION READY FOR USE IN ACTUAL FABRICATION OPERATION

FABRICATION BASED COMPUTER AIDED DESIGN SYSTEM USING VIRTUAL FABRICATION TECHNIQUES

FIELD OF INVENTION

This invention relates in general to the field of performance simulation and analysis of fabrication and manufacturing processes. More specifically the invention concerns a method for defining, modeling, visualizing, analyzing and simulating the geometry of a micro-electro mechanical (MEMS) device through the accurate reproduction in a virtual environment of a set of process steps involved in the fabrication of such a MEMS or other semiconductor device and the visualization, simulation and analysis of the device when it is subjected to various loads and boundary conditions and to the analysis of the properties of the materials that comprise the device.

BACKGROUND OF THE INVENTION

The need for smaller, higher performance, and more complex electronic devices increases dramatically with each new generation of device. Accordingly the complexity of the process of designing and fabricating semiconductor materials necessary to meet these needs has also increased. With this increase in complexity has come an increase in cost. This increase in cost is due in large part to the critical need for optimal material selection and processing in the semiconductor design and fabrication process. As the complexity demanded by the market increases, the device designs required to provide this desired complexity become increasingly critical.

Traditionally, design engineers have been forced to rely on trial-and-error fabrication runs to gain experience concerning how to create a process and select process parameters that will yield their desired design. As the complexity of the devices demanded continues to increase, this approach of using many time and resource consuming design-fabricate-test iterations becomes increasingly cost prohibitive. Design and process engineers must know how the devices that they wish to fabricate will behave once completed. They must know how the devices that they design will be fabricated. They must know how the materials that they select for fabrication will behave under the changing parameters of the fabrication process. Without this information, the design engineers have no way of knowing an actual laboratory fabrication process can be developed that will yield the device as they have envisioned. The key to solving both of these problems is to provide a system that accurately models both the resulting device and the fabrication process steps necessary to arrive at that device in the laboratory, while allowing for analysis of the device during fabrication and after completion. Without such a dual purpose system, the need remains unfilled.

The existing art shows that some methods of modeling the desired design have been developed. However, these methods focus on the geometry of the desired device and not on the process necessary to arrive at that device. None of these methods accurately models the series of fabrication process steps that the device must be exposed to during an actual fabrication process to achieve the desired design. They focus instead only on the finished design, leaving the process engineer once again to resort to a trial and error process to develop a fabrication process. Because existing methods do not use actual fabrication process steps to arrive at the desired design, they are often more complicated to operate and less intuitive to the user. Because the actual fabrication process steps are not accurately modeled by existing methods, these methods are also incapable of providing for accurate representation of data concerning the properties that any of the materials in the design exhibit either during or after the completion of the fabrication process steps. Due to this lack of a truly realistic process modeling capability, existing methods are incapable for example of determining if the resultant device is actually capable of being fabricated in the laboratory, or if one of the processes in the fabrication will cause failure prior to the completion of the fabrication process.

Due to these shortcomings, existing methods also fail to provide for anything more than a limited analysis of the resulting device. Since the existing methods do not provide for an accurate modeling of the actual fabrication process steps, any and all analyses of the device may not be performed until it has been completely modeled. Thus valuable information that may be gained by analyzing the device at a point during the fabrication process is not available. Furthermore, the traditional mesh-based analysis methods that are available for use in analyzing the completed device are inefficient, time consuming, and woefully inaccurate.

DESCRIPTION OF THE INVENTION

In view of the foregoing a need exists for a true process based fabrication, modeling and analysis tool that allows the user to accurately design, visualize, simulate, and analyze the design of a micro-electro mechanical (MEMS) or other semiconductor device through a computer aided simulation of its actual fabrication process. Central to such an analysis tool is a readily available and accurate database of measured data regarding the numerous process steps that can be involved in a fabrication process. Such an analysis tool allows the designer to reduce the number of iterations in the process design by accurately modeling the design-fabricate-test iterations without actually fabricating and testing the devices. Such a tool would create a much needed savings in both time, materials, and cost.

It is therefore a primary object of the invention to provide a highly reliable fabrication process simulation system (FPSS) that is applicable to all forms of fabrication processes whose properties may be dependent on several parameters, including thin films for semiconductor and micro-electro mechanical fabrication.

It is another object of the invention to provide an FPSS from which the geometry of the device may be determined using the results of the steps in the fabrication process sequence of the device.

It is another object of the invention to provide an FPSS from which the performance of the actual device may be simulated.

It is another object of the invention to provide an FPSS that directly relates the performance characteristics of the simulated device to the steps in the fabrication process sequence of the device.

It is another object of the invention to provide a modeling and analysis tool that provides a direct link between the simulation of the device and a database of the material parameters of the materials that comprise the device.

It is another object of the invention to provide a modeling and analysis tool that can be used to reduce the cost involved with designing, fabricating, and testing a semiconductor or MEMS device by reducing the number of design-fabricate-test iterations necessary to yield a viable fabrication process.

It is another object of the invention to provide an FPSS that can be used to reliably control and simulate thin film fabrication of all types of materials having any number of parameters, including metals, compounds, ceramics, semiconductors and glass.

It is another object of the invention to provide an FPSS which is coupled to a highly-interactive cognitive user-interface capable of providing the user with a tabular or multi-dimensional graphical representation of the FPSS estimation in any set of units.

It is another object of the invention to provide an FPSS that allows the Operator to analyze the fabrication process at any point in the process and to modify the parameters of the according to the results of the analyses.

It is another object of the invention to provide a FPSS which can predict numerous other thermal, physical, electrical, mechanical, and optical material properties of the finished device, including but not limited to bi-axial modulus, birefringence, coefficient of thermal expansion, density, dielectric constant, dynamic tensile modulus, moisture absorption, Poisson's Ratio, refractive index, electrical resistivity, stress relaxation time, strain, state transition temperatures, tangent of delta, thermal conductivity, ultimate tensile strength, and Young's Modulus.

It is another object of the invention to provide an FPSS which may be adapted to any user-interface.

Additional objectives, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations pointed out in the claims.

DESCRIPTION OF DRAWINGS

The foregoing summary, as well as the following detailed description of a preferred embodiment of the invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings.

DETAILED DESCRIPTION OF THE INVENTION

The invention comprises a method of designing, visualizing, and simulating the actual process steps in the fabrication of micro-electro mechanical (MEMS) and other semiconductor devices, comprising the steps of building a Process Table, checking each step in the Process Table against the parameter set contained in a fabrication database, visualizing the geometry of the device yielded by performing the processes in the Process Table, performing an analysis on the device yielded by performing the processes in the Process Table that includes the steps of applying loads and boundary conditions to the device, meshing the device structure, refining the mesh structure, performing the analysis, and visualizing the results of the analysis in the form of three-dimensional contour plots of the results. The ultimate goal of the invention is to allow for the design, modeling and visualization of the geometry and behavior of MEMS and other semiconductor devices under the loads and boundary conditions experienced by actual devices at any step in their fabrication process through the accurate recreation of their fabrication process steps.

Figure 1:
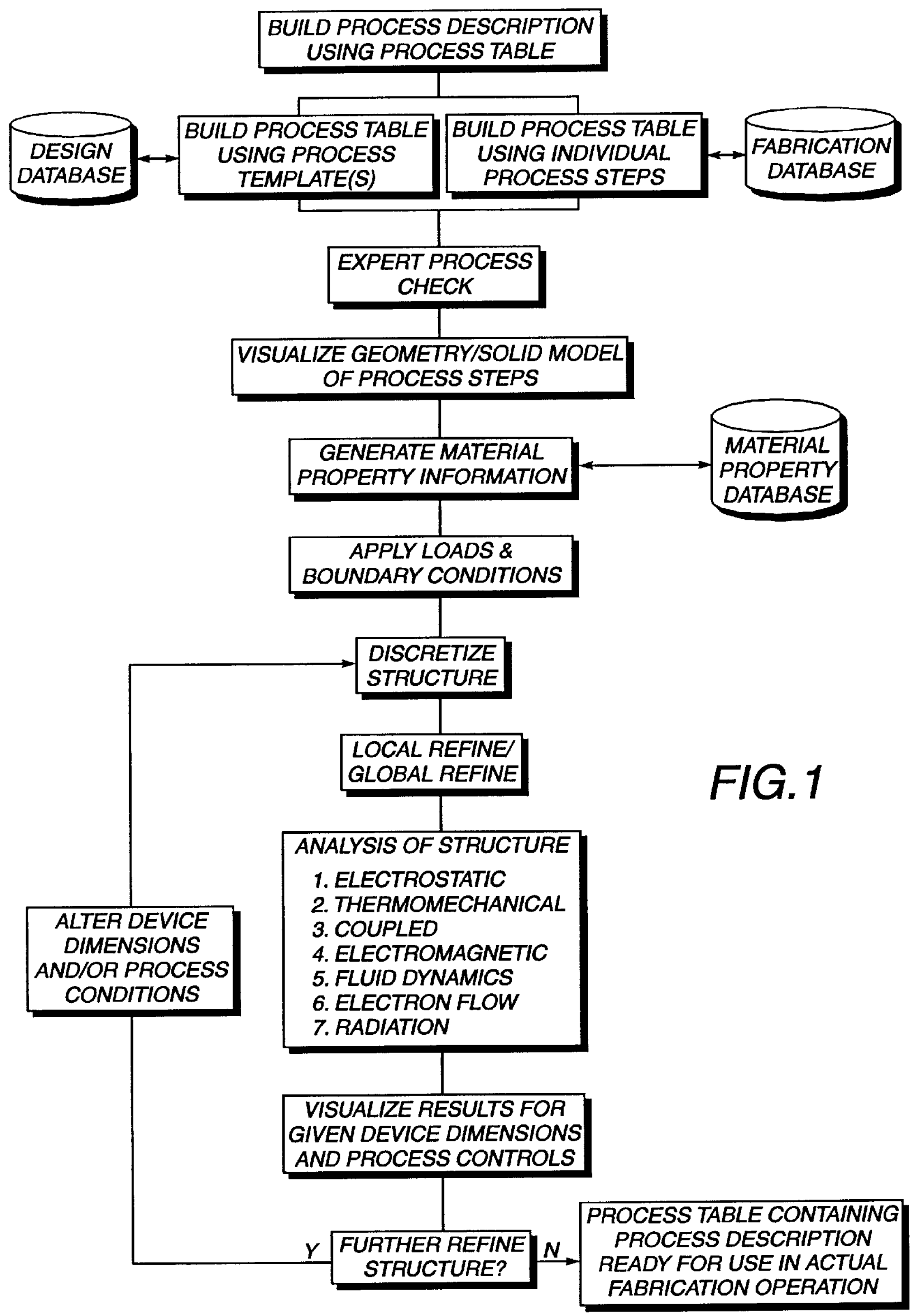
FIG. 1 is a flow diagram representing an example of the logical steps that a user would take in executing the present invention.

In FIG. 1 there is depicted a flow-diagram of the logical steps that a user of the present invention would take when operating the invention. Building a Process Table is comprised of the generation of a list of the individual steps in the process of fabricating the MEMS device. These processes may comprise but are not limited to depositing on a substrate, defining the mask, and etching. The unique process steps and their individual characteristics may be drawn from a Fabrication Database that contains a listing of various processes that may be performed in the fabrication of a device. This database contains actual data regarding real processes that are performed during a fabrication process. The unique process steps and their individual characteristics may also be entered manually by the user and incorporated into the Process Table and Fabrication Database. In some cases the fabrication process will include a discrete operation consisting of a number of individual processes. In such a case, a Process Template may be selected from a database of templates and incorporated into the Process Table. The Process Template may also be uniquely generated by the user and incorporated into the Process Table. The Process Template contains a list of the unique processes necessary to complete the given operation as a step in the fabrication process. The user can incorporate the Process Template into the Process Table and add steps to the process described by the Process Template as the particular fabrication process requires.

It is this interaction between the Fabrication Database and the Process Table that allows the user to model the steps in an actual fabrication process (in the form of a Process Table) without assembling actual physical geometric models. The method described by the present invention yields a true and accurate representation of the physical process steps that would comprise the actual laboratory fabrication process for the device being modeled. The ability of the present invention to accurately model the device both as an end product of the entire fabrication process and as a work in process after any of the steps in the fabrication process is not possible with other methods of designing, visualizing, and simulating the fabrication process.

Figure 2:
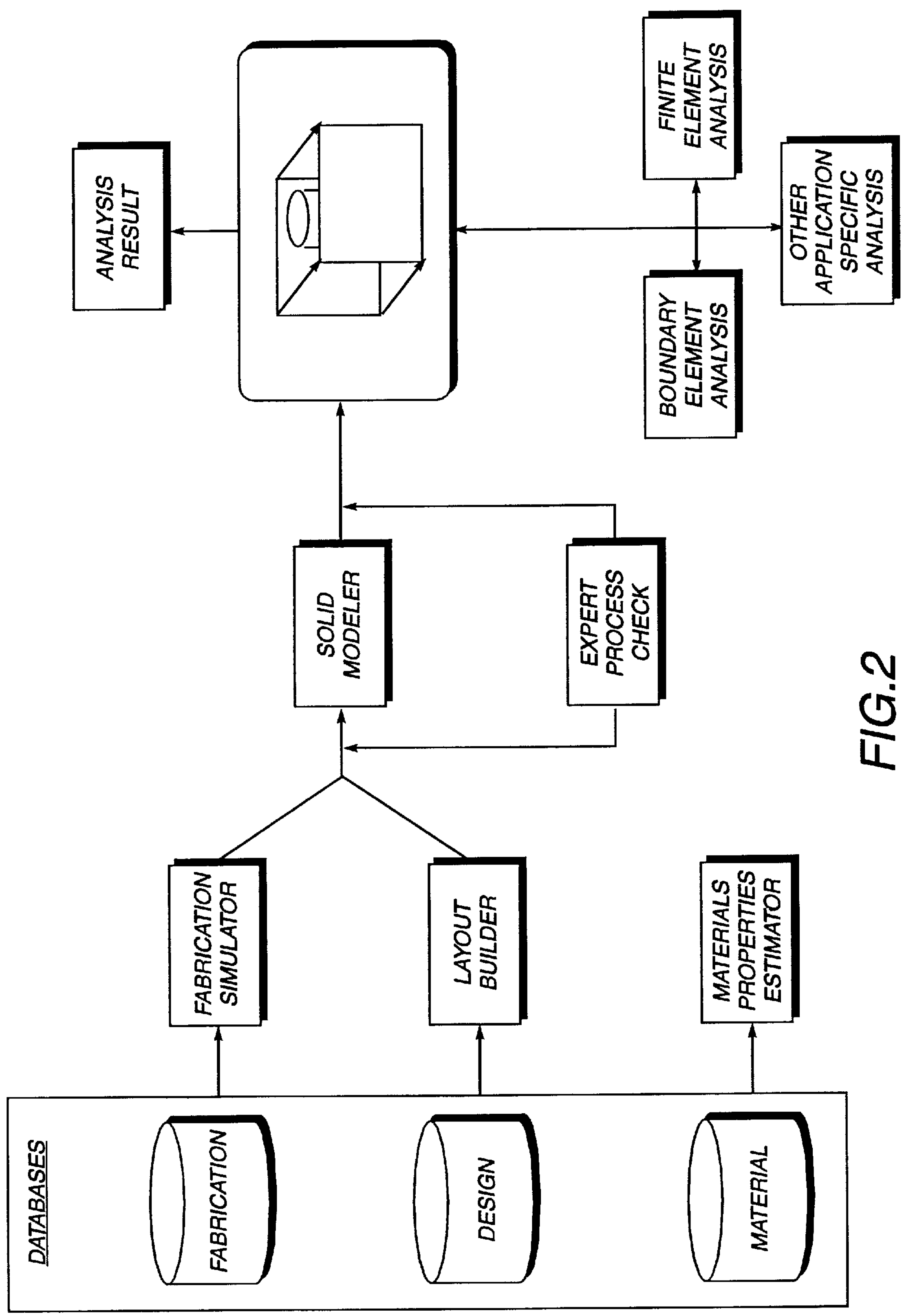
FIG. 2 is a flow diagram representing an overview of the major modules of the present invention and their various interrelations.

Referring now to FIG. 2. The block-diagram in FIG. 2 shows an overview of the primary modules of the present invention and their various interrelationships. After the user has completed building a Process Table, it is passed to Fabrication Simulator, Layout Builder and Material Properties Simulator for processing.

The Fabrication Simulator receives the completed process table and the process conditions that the user has constructed. It outputs to the Solid Modeler the material properties and the geometry of the fabricated device. The Fabrication Simulator employs one of several methods to arrive at this output. For example, it may use a method of empirical fitting to generate an empirical model for the device that is fabricated from the process which is contained in the process table. Alternatively it may create a physical model of the device. In this case, equation methods are used to solve physical equations describing the properties of the device (e.g. the diffusion equation). The user may also create their own model by manually defining the material properties and device geometry for the current process steps and the steps in the process history.

The Layout Builder receives layouts of the mask to be used in the fabrication process. These layouts may be in any one of a number of formats (GDS II, CIF, KIC, DXF, etc.). The Layout Builder allows the user to edit the mask layout if needed. Alternatively the user can use the Layout Builder to create and edit their own mask layout. The result is a two-dimensional representation of the mask structure to be used in the fabrication process.

The Solid Modeler uses the two-dimensional descriptions of the mask layout generated by the Layout Builder, and the Z-dimensional descriptions of the geometry generated by the Fabrication Simulator, to simulate the deposition or etching of layers in the process. As such it uses the actual fabrication process steps to generate a true three-dimensional structure for the device. The Solid Modeler simulates the process of deposition of layers onto the device structure and the process of etching layers from the device structure. The result is a solid, three-dimensional, model of the device that contains data regarding the structure of the device and the properties of the materials that make up the device.

The Expert Process Check is employed either before or after the solid modeling process. In either case, the check analyzes the sequence of the process steps in the process table, the material properties of the materials after the completion of each step in the process table, the geometry of the device after the completion of each step in the process table, and the types of process performed by each step in the process table, against a database of known processes properties, and conventions, to assure that they are allowable. In the case of an error or an operation not contained in the database, the checker gives the user the option of editing the process table until it conforms with a known data point in the database or modifying the database to include the new data point.

At any point in the fabrication process the user is able to view the device as it is modeled. This permits for prediction and visualization of the resulting solid geometry and behavior of the device that is yielded by performing the sequence of process steps in the process as the device is being modeled. This allows the user to perform parametric definition of the device geometry, discretization of the device geometry, selective removal of layers of the device geometry, conformal coating over etched steps, handling material and load information of various steps, etc.

Because the present invention models the device at the completion of any of the steps in the fabrication process as well as the device at the completion of the fabrication process, the device may also be visualized upon the completion of any of the individual steps in the Process Table. Visualizing the device after the completion of any of the individual processes yields a true representation of what the geometry and behavior of the actual device will be upon the completion of any of the actual fabrication processes that are performed on it. The method herein creates a true virtual fabrication design and modeling tool rather than merely an outcome or end product design and modeling tool.

The present invention may also be coupled to a material property analysis database and device to allow for analysis of the properties of the materials of the device that results from the fabrication process in the process table.

The simulation of the MEMS device that is yielded by performing the process steps in the Process Table is performed using a Performance Simulator, this allows the user to test the performance of their device under desired loads and boundary conditions. The type of analysis may include but is not limited to electrostatic analysis, thermo-mechanical analysis, electro-magnetic analysis, fluid dynamic analysis, electron flow analysis, radiation analysis, anosotropic etching analysis. The invention is capable of supporting numerous analysis types, including coupled and uncoupled electro- and thermo-mechanical analysis. The invention is also capable of performing analysis on multi-dielectric materials. For each type of analysis the user may specify the loads and boundary conditions to be applied to the structure. Through analysis of the modeled device, the invention is capable of relating device performance and material properties directly to the individual steps in the fabrication process of the device. Because of this ability to relate device performance to fabrication parameters, the present invention allows the user to set up experiments that directly optimize device performance by sequentially varying fabrication parameters.

Figure 3:
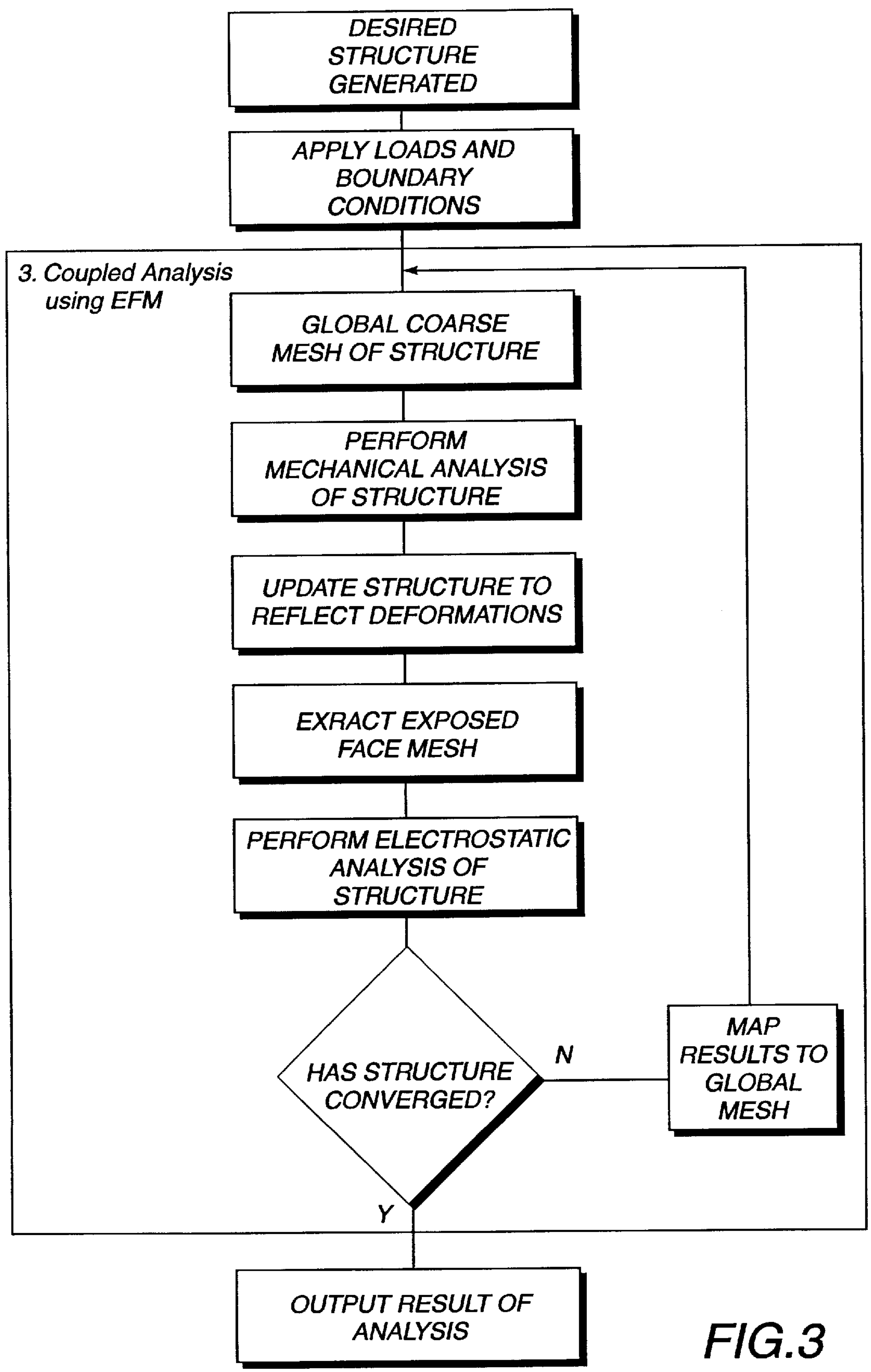
FIG. 3 is a flow diagram representing the primary steps in the exposed face meshing method of analysis utilized by the present invention.

When performing a coupled analysis, the analysis process employs a novel Exposed Face Mesh (EFM) method of discretization. The novel EFM method of analysis yields both increased accuracy and speed of analysis. FIG. 3 depicts the logical steps that the EFM goes through to complete a coupled analysis as performed in the Analysis of Structure step in FIG. 1. The EFM method involves refining only the surface mesh on the chosen exposed faces for boundary element based electrostatic analysis. The traditional volume mesh topology is still employed for finite element or finite difference based mechanical analysis. In an electrostatic analysis, the advantage of this novel method is that the surface mesh for the electrostatic analyses is separated from the volume mesh for the mechanical analyses. Until the present invention it has been difficult to refine only one of these meshes without affecting the compatibility between the meshes and consequently the accuracy of the results. In this way the EFM is particularly tailored to boundary element based electrostatic analysis and finite element or finite difference based mechanical analysis. Using this method results in reduced computational loads while assuring improved accuracy. Using the EFM the surface mesh can be customized for electrostatic analysis purposes (such as refining only the exposed faces), while the volume mesh can remain coarse once the mechanical analysis provides correct results. A comparison of the new EFM method with the standard refining volume mesh method reveals that the former generates far fewer volume mesh nodes for mechanical analysis as well as fewer surface mesh panels for electrostatic analysis than the later while improving the accuracy. The EFM method can be incorporated into existing electro-mechanical analysis systems to enhance performance or implemented as a stand-alone product. Further the method as disclosed can be employed to improve the analysis of any structure that would require an analysis of the effects of a force acting on its surfaces and is not merely restricted to microfabricated and micromachined semiconductors.

The novelty of this analysis method can best be shown through example. In the case of a coupled electromechanical analysis of a micromachined device, the EFM method would take the following form. The governing system of equations for the electromechanical problem can implicitly be expressed as:

$$S=Fm[\mathbf{X0}(M),\ Fe(S+\mathbf{X0},\ V)] \tag{1}$$

where X0(M) is a vector representing the released structure, S is the discretized structure surface displacement, M is the multi-material property information, and V is the applied voltage information. From (1) the numerical error of structure surface displacement can be derived. The numerical error can be approximated as:

$$\delta S = \left(\frac{\delta Fm}{\delta X0}\right)\delta X0 + \left(\frac{\delta Fm}{\delta Fe}\right)\delta Fe \quad (2)$$

Assuming that the original structure X0 is correct, the first term on the right of (2) can be ignored. In (2), dFm/dFe is the surface displacement increment due to electrostatic pressure changes, which is inversely proportional to the Young's module, dFe is the numerical error of electric force of total structure, which is proportional to $V^2$ and is dominated by the electrostatic pressure discretization error on the Exposed Faces. The numerical error will increase as the structure's flexibility increases. To reduce dFe and therefore to suppress the numerical error, the EFM method can be applied, thus significantly reducing the discretization error on exposed faces. The more flexible the structure is, the larger the refining factor should be set in the EFM algorithm to keep the numerical error within the given tolerance.

The EFM method is comprised of the following steps. First the exposed faces are defined and a refining factor N is applied to them. As a result, the total refined panels on each exposed face will be set to $2*N^2$. Then a global three dimensional volume mesh (hexahedral) is generated from the model. The global surface mesh is extracted from the volume mesh. The EFM is located on the global surface mesh. The EFM is refined to $2*N^2$ plane panels as defined in the first step, and all non-exposed faces are removed. Then the mesh for electrostatic analysis is generated and the electrostatic analysis is performed over the electric surface mesh. The electrostatic charge of the exposed face is mapped to the global surface mesh, then the electrostatic pressure over the global surface mesh is derived. The global surface mesh is then re-attached to the three-dimensional volume mesh, and electrostatic pressure loads are applied in the structure. Finally a mechanical analysis is performed and the structure deformation and associated global volume mesh are updated. Given this updated information, the process may be repeated until the increment of the structure deformation is below the given tolerance.

The results of the analysis are then visualized in a three-dimensional representation of the design characteristics as specified by the user (stress, strain, etc.). The numerical results may be displayed in any units specified by the user. The user may then make changes to the sequence of process steps in the Process Table and repeat this method to view the effects of those changes on the final fabricated device or on the device after the completion of any of the individual process steps. In this way the user is able to see how their device will perform under real world conditions. As such this method allows the user to accurately simulate the performance and behavior under the loading and boundary conditions of an actual device.

Accordingly, we claim:

1. A method of performing computer aided design and fabrication of MEMS devices in a virtual environment comprising the steps of:

building a Process Table comprised of MEMS device fabrication process steps;

checking each step in the Process Table against a parameter set contained in a database of actual MEMS device fabrication process steps;

visualizing the geometry of the MEMS device yielded by performing the process steps in the Process Table; and performing an analysis on the MEMS device yielded by performing the process steps in the Process Table, the act of performing comprising:

discretizing the structure of the MEMS device yielded by performing the process steps in the Process Table to generate a volume mesh and a surface mesh, applying loads and boundary conditions to the surface mesh and the volume mesh, analyzing said applying loads and boundary conditions to generate results, and visualizing the results of said analyzing.

2. The method of claim 1 further comprising analyzing multidielectric materials of the MEMS device yielded by performing, the process steps in the process table.

3. A system for assisting a user in the design, fabrication, and analysis of a MEMS device, comprising:

a computer device having a memory;

a plurality of fabrication databases in said memory including a plurality of MEMS device fabrication process steps and process parameters associated with each step;

a Process Table containing a user-defined list of MEMS device fabrication process steps;

an application program means, for execution in said memory of said computer device, for graphically modeling and visualizing the MEMS device that results after each of the process steps in the Process Table is carried out;

a material properties database having data entries, said data entries containing the physical properties of materials after being subjected to a plurality of MEMS fabrication processes; and an interface for relating said fabrication process steps in said Process Table to a corresponding data entry in said material properties database.

4. The system of claim 3, the Process Table comprising a subset of the fabrication process steps in the fabrication database.

5. A method of performing computer aided design and fabrication in a virtual environment comprising the steps of:

building a process table comprised of fabrication process steps;

checking each step in the process table against a parameter set contained in a database of actual fabrication process steps;

visualizing the geometry of a device yielded by performing the process steps in the process table;

performing an analysis on the device yielded by performing the process steps in the process table by applying loads and boundary conditions to the device yielded by performing the process steps in the process table;

discretizing the device structure;

performing one or more methods of electrical, chemical, or mechanical analysis on the discretized structure;

visualizing the results of the analysis in graphical or tabular format; and refining the discretized structure using an exposed face mesh means, comprising the steps of:

generating a global three-dimensional volume mesh from the model, extracting a global surface mesh from the volume mesh, locating the exposed face surface mesh on the global surface mesh, refining the exposed face surface mesh by removing all non-exposed faces, performing an analysis over the refined exposed face surface mesh, and relating the results of the analysis on the refined exposed face surface mesh to the global surface mesh and the global volume mesh.

6. A system for assisting a user in the design, fabrication, and analysis of a semiconductor device comprising:

a computer device having a memory;

a plurality of fabrication databases in the memory including a plurality of fabrication process steps and the process parameters associated with each step;

a process table containing a user-defined list of fabrication process steps;

an application program means, for execution in the computer device, for graphically modeling and visualizing in a virtual computer environment the device that results after each of the process steps in the Process Table are carried out;

an analysis program means, for execution in the computer device, for performing a plurality of analyses on the device that results after any of the process steps in the Process Table are carried out;

the analyses comprising the steps of applying loads and boundary conditions to the device;

the application program further comprising a means for modeling and visualizing in a virtual computer environment the device after each analysis step is performed; and the analysis program means further comprising an exposed face mesh routing comprising:

generating a global three-dimensional volume mesh from the model, extracting a global surface mesh from the volume mesh, locating the exposed face surface mesh on the global surface mesh, refining the exposed face surface mesh by removing all non-exposed faces, performing an analysis over the refined exposed face surface mesh, and relating the results of the analysis on the refined exposed face surface mesh to the global surface mesh and the global volume mesh.

7. The system of claim 6, further comprising, a materials properties database comprising a plurality of materials and the physical properties of those materials after being subjected to a plurality of fabrication processes parameters; and a means for relating the fabrication process steps in the Process Table to the corresponding physical property in the materials properties database.

8. The system of claim 6, the Process Table comprising a subset of the fabrication process steps in the fabrication database.

9. A computer-implemented method of designing and modeling a MEMS device comprising:

building a process table including at least one MEMS device fabrication process step;

checking the at least one MEMS device fabrication process step against at least one predetermined empirical parameter;

generating a mathematical model of the MEMS device yielded by performing at least one process step in the process table; and performing an analysis on the model of the MEMS device, comprising:

discretizing the structure of the model of the MEMS device to yield a volume mesh and an exposed face surface mesh of the model of the MEMS device, applying at least one predetermined load and at least one predetermined boundary condition to the exposed face surface mesh and the volume mesh, analyzing said applying to yield results, and visualizing said applying and the results of said analyzing in a predetermined format.

10. The method of claim 9, wherein said checking comprises:

providing a fabrication database having at least one data entry containing at least one predetermined empirical parameter for at least one actual MEMS device fabrication process step; and relating and determining a difference between at least one step in the process table and at least one corresponding data entry in the fabrication database.

11. The method of claim 9, wherein said discretizing comprises:

generating a global volume mesh of the model of the MEMS device;

extracting a global surface mesh of the model of the MEMS device from the global volume mesh;

locating an exposed face surface mesh of the model of the MEMS device on the global surface mesh; and refining the exposed face surface mesh by removing all non-exposed faces from the exposed face surface mesh.

12. The method of claim 11, wherein said analyzing comprises:

analyzing at least one electrostatic property of the model of the MEMS device using the exposed face mesh;

analyzing at least one mechanical property of the model of the MEMS device using the global volume mesh; and relating the results of said analyzing at least one electrostatic property to the global surface mesh and the global volume mesh.

13. The method of claim 9, wherein said generating comprises:

generating a model of the material properties of the MEMS device yielded by performing at least one process step in the process table;

generating a model of the surface geometry of the MEMS device yielded by performing at least one process step in the process table;

providing at least one layout of a mask to be used in a fabrication process for the MEMS device yielded by performing at least one process step in the process table;

generating a two-dimensional model of a mask structure to be used in a fabrication process for the MEMS device yielded by performing at least one process step in the process table from the at least one layout of a mask; and generating a mathematical model of the MEMS device yielded by performing at least one process step in the process table from the model of the material properties, the model of the surface geometry, and the model of a mask structure.

14. The method of claim 13, further comprising:

providing a fabrication database having at least one data entry containing at least one empirical parameter for at least one actual MEMS device fabrication process step; and relating and determining a difference between at least one step in the process table and at least one corresponding data entry in the fabrication database.

15. A computer-implemented method of designing and modeling a MEMS device comprising:

building a process table including at least one MEMS device fabrication process step;

checking the at least one MEMS device fabrication process step against at least one predetermined empirical parameter;

generating a model of the MEMS device yielded by performing at least one step in the process table;

discretizing the structure of the model of the MEMS to yield a volume mesh of the model of the MEMS device and an exposed face surface mesh of the model of the MEMS device, said discretizing comprising:

generating a global volume mesh of the model of the MEMS device, extracting a global surface mesh of the model of the MEMS device from the global volume mesh, locating an exposed face surface mesh of the model of the MEMS device on the global surface mesh, and refining the exposed face surface mesh by removing all non-exposed faces from the exposed face surface mesh;

applying at least one predetermined load and at least one predetermined boundary condition to the exposed face surface mesh and the volume mesh;

analyzing said applying to yield results; and visualizing said applying and the results of said analyzing in a predetermined format.

* * * * *

UNITED STATES PATENT AND TRADEMARK OFFICE

CERTIFICATE OF CORRECTION

PATENT NO. : 6,116,766
DATED : September 12, 2000
INVENTOR(S) : Fariborz Maseeh et al.

It is certified that error appears in the above-identified patent and that said Letters Patent is hereby corrected as shown below:

Column 1,
Line 4, insert -- This invention was made with Government support under contract N00014-93-C-0212 awarded by the Office of Naval Research. The Government has certain rights in the invention. --

Signed and Sealed this

Fourteenth Day of October, 2003

JAMES E. ROGAN
*Director of the United States Patent and Trademark Office*